United States Patent [19]

Hogan

[11] 4,052,677
[45] Oct. 4, 1977

[54] NON-LINEAR FUNCTION GENERATOR WITH SWITCHED CHANNELS

[75] Inventor: James A. Hogan, Hatfield, Pa.

[73] Assignee: Honeywell, Inc., Minneapolis, Minn.

[21] Appl. No.: 727,759

[22] Filed: Sept. 29, 1976

[51] Int. Cl.$^2$ .................. H03K 5/153; G06G 7/12
[52] U.S. Cl. .................. 328/143; 307/230; 307/350; 330/1 A
[58] Field of Search .................. 330/1 A; 328/143; 235/150.1, 197; 307/230, 350, 251

[56] References Cited

U.S. PATENT DOCUMENTS

| 3,851,259 | 11/1974 | Porawski | 330/1 A |
| 4,011,504 | 3/1977 | DePillo | 328/143 |

Primary Examiner—Stanley D. Miller, Jr.
Assistant Examiner—B. P. Davis
Attorney, Agent, or Firm—Laurence J. Marhoefer; Lockwood D. Burton; George E. Bodenstein

[57] ABSTRACT

The generator includes an input terminal, an output terminal, and three channels connected between the input and output terminals. The first channel contains a first amplifier and a first FET switch connected in series between the terminals. The second channel contains a second amplifier and a second FET switch connected in series between the terminals. The third channel contains an adjustable resistor and a third FET switch connected in series between the terminals. An adjustable bias signal positively offsets the output signal of the first amplifier and negatively offsets the output signal of the second amplifier to produce a signal deadband. When an applied input signal lies within the deadband, a signal from the resistor lies between the amplifier output signals, and a pair of comparators turn on the third FET and turn off the first and second FET's. This produces an output signal which follows the input signal with a gain determined by the resistor adjustment. When the input signal is out of the deadband, the comparators turn on the appropriate one of the first and second FET's and turn off the third FET. This causes the output signal to follow the input signal with a gain determined by that of the corresponding one of the amplifiers.

6 Claims, 3 Drawing Figures

FIG. 1

NON-LINEAR FUNCTION GENERATOR WITH SWITCHED CHANNELS

BACKGROUND OF THE INVENTION

1. Field of the Invention

The present invention relates generally to electrical function generators, and relates specifically to function generators of the non-linear type. Such a function generator characteristically produces an electrical output signal which follows a varying input signal, but which is related to the input signal according to a desired function which varies in a predetermined manner as the input signal varies. More specifically, the invention relates to that type of non-linear function generator which has particular utility in non-linear process control systems or controllers, wherein the function generator provides the desired non-linear relationship between a deviation or error signal and the control action produced in accordance with that error signal.

2. Description of the Prior Art

Non-linear function generators as defined above are known in the art. Such a generator characteristically includes an input connection, an output connection, and biased amplifying and/or attenuating means connected between those connections. The input connection is arranged to receive a varying input signal. As long as this signal lies within a predetermined signal range or band which is established by the noted biasing, the apparatus produces an output signal which follows the input signal with a desired gain. In other words, the output signal is then proportional to the input signal according to a desired proportionality constant. When the input signal lies outside of the noted band, the output signal is made to follow the input signal with a different, usually higher, gain.

When such a function generator is employed in one of the noted non-linear control systems, the generator input signal is usually the controlled process variable deviation or error signal. Such a signal is generally obtained by comparing a set point signal, representing a desired value of the controlled variable, with a signal representing the instantaneous measured or actual value of the variable. The noted band, within which the output signal follows the input signal with the first-noted gain, is then the so-called deadband of the control system. This output signal is applied to a control device or controller portion of the system to cause that device to appropriately affect or influence the value of the variable as necessary to minimize the error signal.

In the function generator application being described, the gain for the deadband is made desirably low. Thus, when the actual value of the variable is sufficiently close to the desired value that the error signal lies within the deadband, the generator output signal follows the error signal with this low gain, and so causes the corrections which the control device makes to the value of the variable to be suitably small.

When the actual value of the variable becomes so different from the desired value that the error signal lies outside of the deadband, the higher gain with which the output signal then follows the error signal causes the corrections made by the control device to be suitably larger, to the end of hastening the return of the actual value of the variable to the desired value therefor. Thus, the controlled non-linearity of the generator output with respect to the error signal provides the increased corrective action needed when the actual value of the controlled variable departs from the desired value by what is considered to be an excessive extent.

An example of the known non-linear function generators and their use in non-linear control systems as just described is found in the Shinskey U.S. Pat. No. 3,794,817. The non-linear function generator of the control system of that patent is shown in FIG. 3 thereof, and is seen to include a pair of transistors and an operational amplifier.

Another typical example of the known non-linear function generators for use in non-linear controllers is the generator disclosed in the Porawski U.S. Pat. No. 3,851,259. The generator of that patent utilizes three operational amplifiers and two diodes to produce a non-linear output signal. Still another such generator, but employing vacuum tubes and diodes, is shown in FIG. 3 of the Roper et al. U.S. Pat. No. 2,895,502. Other examples of more general purpose function generators with which I am familiar are those disclosed in the Harder U.S. Pat. No. 2,697,201, the Herzog U.S. Pat. No. 3,158,739, and the Tsuda U.S. Pat. No. 3,621,227.

Each of the known non-linear function generator arrangements with which I am familiar, as typified by the arrangements of the noted patents, possesses one or more characteristics or shortcomings which has made it less than desirable for use in certain applications. For example, a function generator of the type which is shown in the Porawski patent has the disadvantage of not providing an adjustable gain for the deadband. A function generator of the type which is shown in the Roper et al patent does not lend itself to present day construction techniques. The function generators which are shown in the Harder, Herzog, and Tsuda patents are not of forms which are readily arranged or practically constructed to provide the type of non-linear output signal discussed above.

Finally, a function generator of the type which is shown in FIG. 3 of the Shinskey patent has the disadvantage that the change between the deadband gain and the higher gain, for error signals outside of the deadband, does not occur abruptly, as is desirable. Instead, as shown in FIG. 2a of the Shinskey patent, the noted change in gain occurs gradually, due to the characteristics of transistors. It has been found that the parameters of the transistors which cause this gradual gain change tend to be unstable, due to temperature dependence and the like, thereby making the transition points between the two gain values unstable. Such instability is undesirable in certain applications, and amounts to a shortcoming of the apparatus providing it.

SUMMARY OF THE INVENTION

Accordingly, it is an object of the present invention to provide improved non-linear function generator apparatus which avoids the undesirable characteristics and shortcomings of the previously known forms of such apparatus. Specifically, it is an object of the invention to provide such improved apparatus which is of a relatively simple and practically constructable form, and which, nevertheless, readily provides the above-described form of non-linear action and output signal which is useful in non-linear control systems.

A more specific object of the invention is to provide such improved function generator apparatus wherein the gain provided by the apparatus shifts abruptly at consistently the same preset values of the input signal each time that this signal moves into or out of the chosen range or band of the apparatus, hereinafter referred to as the deadband. It is a further object of the invention to provide such improved apparatus wherein the effect of temperature and supply voltage changes on the width of the deadband is minimized, and wherein the deadband gain and width are readily established.

To the end of accomplishing the above-noted and other desirable objects, non-linear function generator apparatus according to the present invention includes a plurality of switched channels connected between input and output connections of the generator. Two of these channels include amplifiers which are adjustably biased so that their output signals always follow the input signal to the generator with offsets determined by the adjusted extent of the biasing. This establishes the width of the deadband provided by the apparatus.

As long as the input signal lies within the chosen deadband, the output signal follows the input signal by way of a third of the channels and with a readily established gain determined by means in that channel. When the input signal moves to a value above the established deadband, the switch of one of the noted two channels is closed, and the third channel switch is opened. The output signal than follows such an out-of-deadband input signal with a gain determined by the gain of the amplifier located in that channel. Similarly, when the input signal moves to a value below the deadband, the switch of the third channel is again opened, and the switch of the other of the noted channels is closed to couple the input connection to the output connection through the amplifier of the last-noted channel, whose gain than determines the relationship between the output and input signals. Since the shift from one gain value to the other is produced by the positive opening and closing of switching devices, each transition between two gain values occurs sharply and with the required degree of stability. Moreover, the use of such switching devices and their cooperating operational amplifiers makes the improved apparatus according to the present invention of a desirably simple, reliable, and readily fabricated construction.

BRIEF DESCRIPTION OF THE DRAWINGS

A better understanding of the present invention may be had from the following detailed description when read in connection with the accompanying drawings, wherein.

DETAILED DESCRIPTION OF THE PREFERRED EMBODIMENT

THE APPARATUS OF FIG. 1

Figure 1:
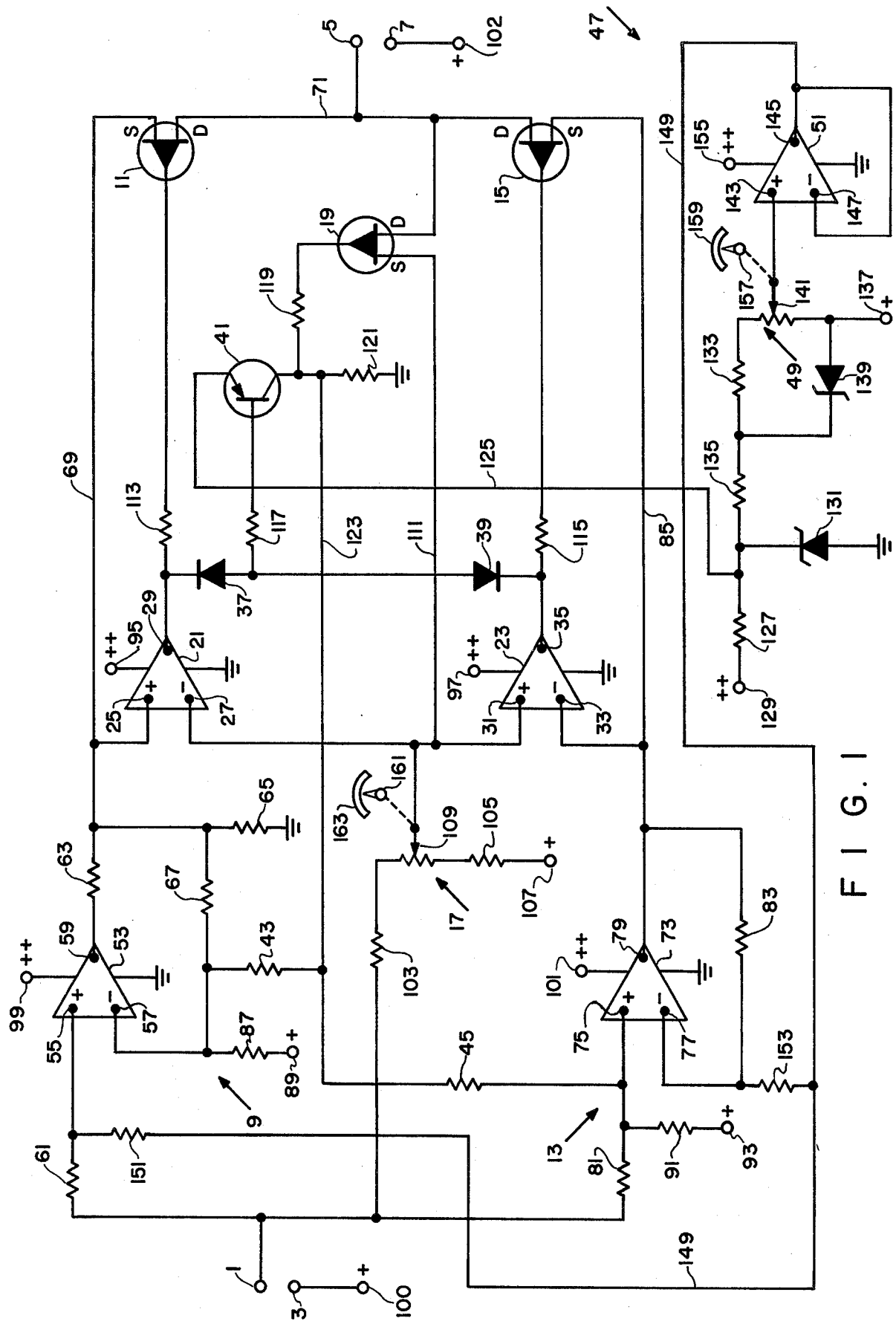
FIG. 1 is a circuit diagram of a non-linear function generator embodying the present invention.

The non-linear function generator apparatus shown in FIG. 1, and illustrating a preferred example of the abovedescribed improved apparatus embodying the present invention, is arranged to produce an output signal which follows an input signal with one gain when the input signal lies within a predetermined signal band, and which follows the input signal with a different gain when the input signal lies outside of said band. Since such a generator is particularly suited for use in a non-linear process control system, the FIG. 1 generator will be described herein as though it is employed in such a system, such as the typical system illustrated in FIG. 2. It is to be understood, however, that function generators according to the present invention, such as that illustrated in FIG. 1, are not limited to being process control function generators, but instead are useful in many other fields and applications.

Figure 2:
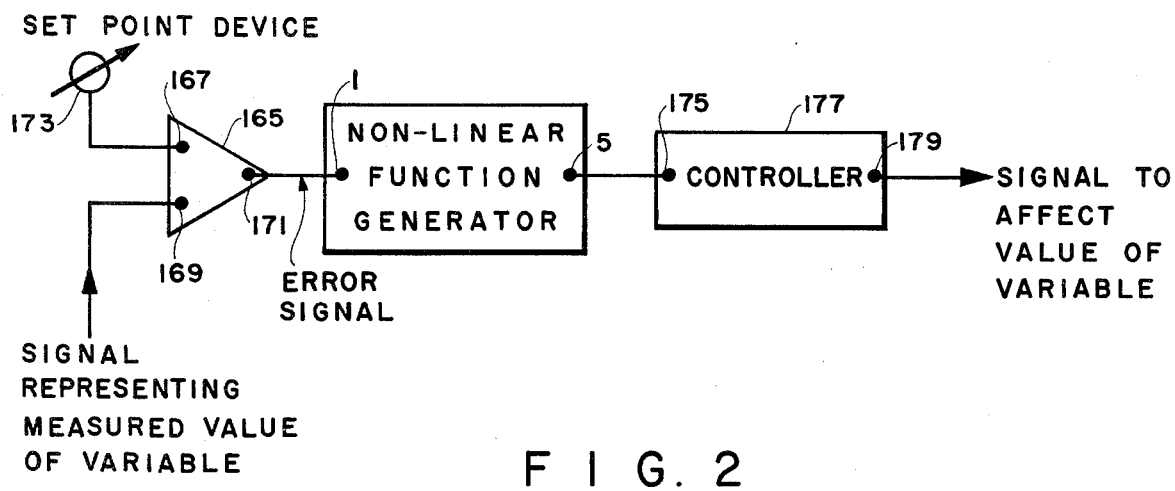
FIG. 2 is a block diagram of a typical non-linear process control system of the type with which the FIG. 1 function generator can be used to advantage.

In accordance with the foregoing, the FIG. 1 generator will be treated as though it is arranged to provide the required non-linear controller input signal in the typical control system of FIG. 2. Thus, it is considered that the input connection of the FIG. 1 generator is connected to receive the deviation or error signal produced in the FIG. 2 control system, and that the generator produces a corresponding non-linear output signal which is used to operate the controller portion of the FIG. 2 control system.

In consonance with the foregoing brief description of the FIG. 1 apparatus, the latter includes input terminals 1 and 3 and output terminals 5 and 7. The terminals 1 and 3 constitute the input connection to the apparatus, and the terminals 5 and 7 constitute the output connection from the apparatus.

Three parallel channels or paths are connected between the input terminal 1 and the output terminal 5. The first of these channels includes a first feedback amplifier 9 connected in series with the source-drain path of a first FET switch 11. The second of the three channels includes a second feedback amplifier 13 connected in series with the source-drain path of a second FET switch 15. The third of the three channels includes a gain-determining adjustable resistor 17 connected in series with the source-drain path of a third FET switch 19.

The FIG. 1 apparatus also includes a first comparator 21 and a second comparator 23. Each of these comparators is in the form of an operational amplifier. The comparator 21 has a non-inverting input terminal 25, an inverting input terminal 27, and an output terminal 29. Similarly, the comparator 23 has a non-inverting input terminal 31, an inverting input terminal 33, and an output terminal 35. The output signal of each of these comparators on its corresponding output terminal is positive as long as the comparator non-inverting input terminal is positive with respect to the corresponding inverting input terminal. When the inverting input terminal of either of the comparators 21 and 23 becomes positive with respect to the corresponding non-inverting input terminal, the output signal of that comparator switches to a negative value.

Also included in the FIG. 1 apparatus in a control portion for the third channel FET switch 19. This portion includes diodes 37 and 39, a transistor 41, and a positive feedback connection including resistors 43 and 45.

Finally, the FIG. 1 apparatus includes a bias signal producing means 47. The latter includes an adjustable bias setting resistor 49 and an isolating or follower operational amplifier 51.

The manner in which the above-noted elements and portions are interconnected in the FIG. 1 apparatus will now be described. The first channel feedback amplifier 9 includes an operational amplifier 53 having a non-inverting input terminal 55, an inverting input terminal 57, and an output terminal 59. The input terminal 55 is connected through a resistor 61 to the apparatus input terminal 1. The output terminal 59 is connected through a resistor 63 and a resistor 65 to apparatus common. The junction between the resistors 63 and 65 is connected through a resistor 67 to the input terminal 57.

The last-noted junction is also connected by a conductor 69 to the source of the first channel FET switch 11. The drain of the latter is connected to the apparatus output terminal 5 by way of an output conductor 71. Consequently, the noted first channel contains the feedback amplifier 9 connected in series with the first FET switch 11 between the apparatus input terminal 1 and the apparatus output terminal 5.

The second channel feedback amplifier 13 includes an operational amplifier 73 having a non-inverting input terminal 75, an inverting input terminal 77, and an output terminal 79. The input terminal 75 is connected through a resistor 81 to the apparatus input terminal 1. The output terminal 79 is connected through a resistor 83 to the input terminal 77. The output terminal 79 is also connected by a conductor 85 to the source of the second channel FET switch 15. The drain of the latter is connected to the apparatus output terminal 5 by way of the output conductor 71. Consequently, the noted second channel contains the feedback amplifier 13 connected in series with the second FET switch 15 the apparatus input terminal 1 and the apparatus output terminal 5.

It is desirable to note at this point that the FIG. 1 apparatus is supplied with energizing voltage by way of several supply terminals. Each of these supply terminals is arranged to be connected to the corresponding output or source terminal of a suitable energizing voltage source, not shown. Certain of these supply terminals which are arranged to be connected to a positive source terminal of such a source are identified in FIG. 1 by a single plus symbol (+). The remainder of these supply terminals is arranged for connection to a source terminal of the noted source which is more positive than the first mentioned source terminal. These latter supply terminals are identified in FIG. 1 with two symbols (++). The negative terminal of the noted source is considered to be connected to apparatus common. This arrangement makes it unnecessary to have the voltage source furnish any voltage which is negative with respect to apparatus common, and yet allows the apparatus to operate above and below a pedestal or reference value, which is the value of the voltage that is supplied to the + supply terminals. Consequently, the + supply voltage is uitlized as a reference voltage throughout the apparatus.

The energizing and reference voltage connections for the first and second channels as defined above will now be described. The inverting input terminal 57 of the amplifier 53 is connected through a resistor 87 to a + supply terminal 89. Similarly, the non-inverting input terminal 75 of the amplifier 73 is connected through a resistor 91 to a + supply terminal 93. Each of the operational amplifiers 21, 23, 53, and 73 is provided with a respective ++ supply terminal 95, 97, 99 and 101. Each of the last-mentioned amplifiers is also equipped with a supply connection to apparatus common.

The terminal 3 of the input connection to the apparatus is shown as being connected to a + supply terminal 100. Similarly, the terminal 7 of the output connection of the apparatus is shown as being connected to a + supply terminal 102. This is done to reference the input and output signals of the apparatus to the + supply voltage, which, as previously noted, is utilized throughout the apparatus as a reference voltage.

In the noted third channel of the FIG. 1 apparatus, the body of the adjustable resistor 17 has one end which is connected through a resistor 103 to the apparatus input terminal 1. The remaining end of the resistor 17 body is connected through a resistor 105 to a + supply terminal 107. The slider 109 of the resistor 17 is connected by a conductor 111 to the source of the third FET switch 19, the drain of which is connected to the output conductor 71 and thence to the apparatus output terminal 5. Consequently, the noted third channel contains the adjustable resistor 17 connected in series with the third FET switch 19 between the apparatus input terminal 1 and the apparatus output terminal 5.

The comparator 21 is connected to respond to the difference between the output signal of the first channel amplifier 9 which appears on the conductor 69, and the signal of the third channel which appears on the slider 109 and the conductor 111. To this end, the non-inverting input terminal 25 of the comparator 21 is connected to the first channel conductor 69, and the inverting input terminal 27 of the comparator 21 is connected to the slider 109. Similarly, the comparator 23 is connected to respond to the difference between the output signal of the second channel amplifier 13 which appears on the conductor 85, and the noted signal of the third channel which appears on the slider 109. To this end, the inverting input terminal 33 of the comparator 23 is connected to the second channel conductor 85, whereas the non-inverting input terminal 31 of the comparator 23 is connected to the slider 109.

The purpose of the comparator 21 is to control the conductivity or switching action of the first channel FET switch 11, whereas the purpose of the comparator 23 is to control the conductivity or switching action of the second channel FET switch 15. Additionally, the comparators 21 and 23 are arranged so that they jointly control the conductivity or switching action of the third channel FET switch 19 by way of the diodes 37 and 39 and the transistor 41.

To the end of providing the noted control of the FET switches, the output terminal 29 of the comparator 21 is connected through a resistor 113 to the gate of the FET switch 11. Similarly, the output terminal 35 of the comparator 23 is connected through a resistor 115 to the gate of the FET switch 15. In the circuit portion which controls the switching of the FET switch 19, the base of the transistor 41 is connected through a resistor 117 to the anode of each of the diodes 37 and 39. The cathode of the diode 37 is connected to the comparator output terminal 29, and the cathode of the diode 39 is connected to the comparator output terminal 35. The collector of the transistor 41 is connected through a resistor 119 to the gate of the FET switch 19, and is connected through a resistor 121 to apparatus common.

The collector of the transistor 41 is also connected by a conductor 123 and the aforementioned resistor 43 to the inverting input terminal 57 of the amplifier 53. The conductor 123 is also connected through the aforementioned resistor 45 to the non-inverting input terminal 75 of the amplifier 73. These connections provide a positive feedback action for the transistor 41 and the FET switch 19 which will be described hereinafter.

The emitter of the transistor 41 is energized by being connected through a conductor 125 and a resistor 127 to a ++ supply terminal 129. A zener diode 131 is connected between the conductor 125 and apparatus common in order to hold a constant voltage on the emitter of the transistor 41.

The bias producing portion 47 of the FIG. 1 apparatus is also energized from the supply terminal 129. To this end, the upper end terminal of the body of the adjustable resistor 49 is connected through a resistor 133 and a resistor 135 to the end of the resistor 127 which is connected to the conductor 125 and to the zener diode 131. The lower end terminal of the body of the resistor 49 is connected to a + supply terminal 137. This terminal is also connected through a zener diode 139 to the junction between the resistors 133 and 135.

The slider 141 of the resistor 49 is connected to the non-inverting input terminal 143 of the follower amplifier 51. The output terminal 145 of the amplifier 51 is connected to the inverting amplifier input terminal 147, and is connected to a conductor 149. The latter, in turn, is connected through a resistor 151 to the non-inverting input terminal 55 of the amplifier 53, and is connected through a resistor 153 to the inverting input terminal 77 of the amplifier 73. The amplifier 51 is powered by way of a connection to a ++ supply terminal 155 and a connection to apparatus common.

As a result of the construction just described, the bias portion 47 supplies a bias signal over the conductor 149 to the amplifier input terminal 55 in the first channel and to the amplifier input terminal 77 in the second channel. The value of this signal depends on the adjusted position of the slider 141 of the resistor 49. To the end of facilitating this adjustment, the slider 141 is provided with an adjusting knob and pointer device 157 which has a cooperating scale 159. Similarly, the slider 109 of the resistor 17 in the third channel is provided with a knob and pointer device 161 having a cooperating scale 163.

THE APPARATUS OF FIG. 2

As previously noted, the block diagram of FIG. 2 is provided to illustrate typical non-linear control system of the type with which a function generator of the form illustrated in FIG. 1 is frequently used. Specifically, in order to best illustrate the use and operation of the FIG. 1 function generator, and not by way of limitation, it is assumed herein that the latter forms a part of the FIG. 2 control system.

The illustrative control system of FIG. 2 is shown as including a comparator 165 having input terminals 167 and 169, and having an output terminal 171. The comparator 165 receives and compares two input signals. One of these signals comes from a set point device 173 and represents the desired value of the variable which the FIG. 2 apparatus controls. This signal is applied to the input terminal 167. The other of the two comparator input signals comes from a measuring device and represents the measured or actual value of the variable. This signal is applied to the input terminal 169.

The comparator 165 produces at its output terminal 171 a deviation or error signal which represents the difference between the desired and actual values of the variable. The comparator output terminal 171 is shown as being connected to the function generator input terminal 1 to illustrate the assumption, for descriptive purposes, that the input signal which is applied to the input connection of the FIG. 1 function generator is the error signal from the comparator 165.

The output terminal 5 of the function generator is shown in FIG. 2 as being connected to the input terminal 175 of a control device or controller portion 177 of the FIG. 2 apparatus. This illustrates that the controller 177 is controlled or operated in accordance with the output signal which the function generator produces in its output connection. The controller 177 has an output terminal 179 which is shown as supplying a signal or controlling action which effects the value of the controlled variable.

OPERATION OF THE APPARATUS OF FIGS. 1 AND 2

Figure 3:
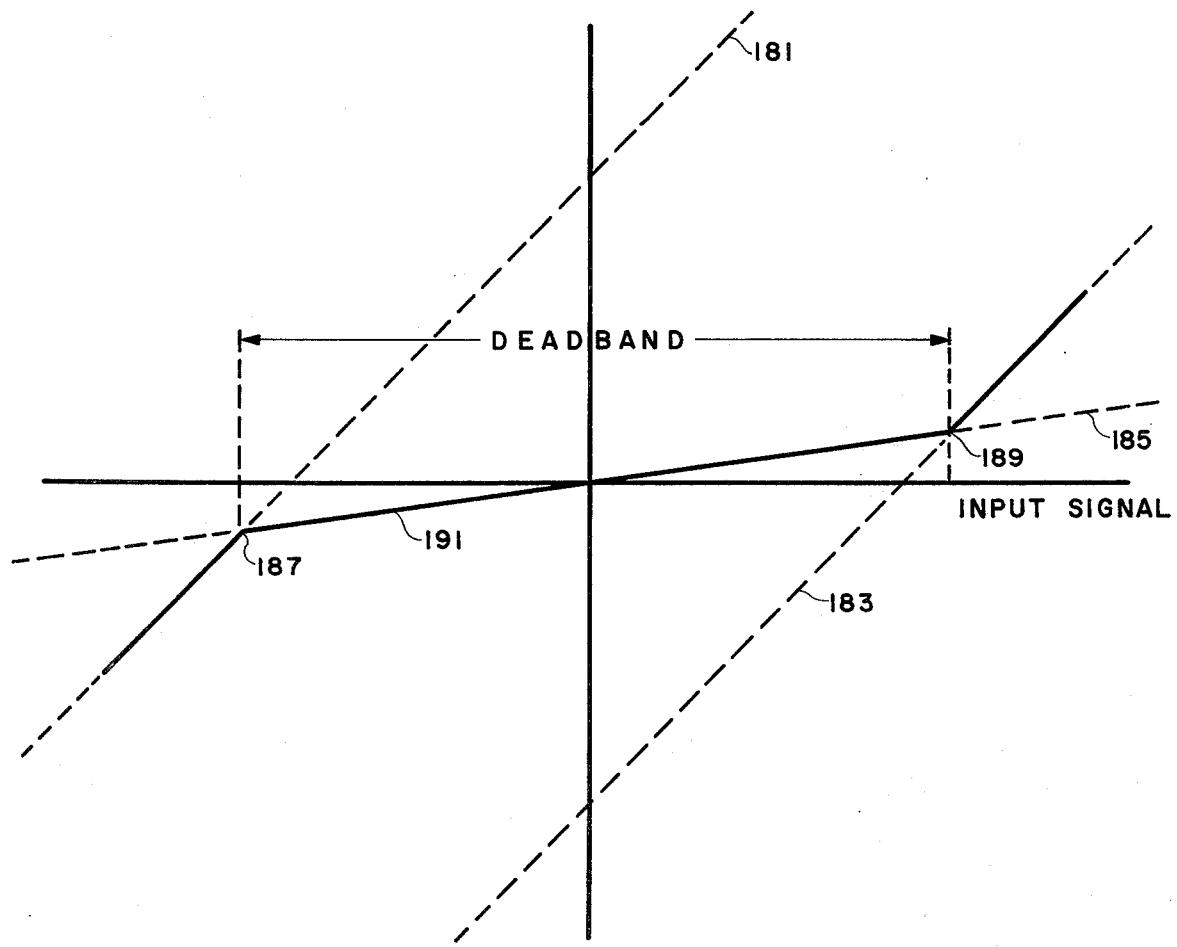
FIG. 3 is a curve diagram illustrating the output signal/input signal relationship provided by the function generator of FIG. 1.

As previously noted, the operation of the FIG. 1 function generator will be described for the situation wherein this generator is included in the FIG. 2 control system as shown. This operation description will also be made with reference to the curve diagram of FIG. 3. That diagram shows the relationships between certain signals in the FIG. 1 apparatus for an assumed typical adjusted condition of the latter and for assumed typical conditions of operation of the FIG. 2 control system. In FIG. 3, the values of the generator input or error signal are plotted along the horizontal or X axis, and the resulting values of the signals on the conductors 69, 71, 85, and 111 are read from the vertical or Y axis.

In the presence of the error signal applied to the generator input terminal 1, the first channel amplifier 9 produces on the conductor 69 an amplifier output signal which follows the error signal with a gain which is the gain of the amplifier 9, and with a positive offset determined by the bias signal on the conductor 149 as set by the position of the slider 141 of the adjustable resistor 49. The relationship between this signal on the conductor 69 and the error signal on the input terminal 1 is shown in FIG. 3 by the dashed line curve 181. The gain of the amplifier 9 is shown by the slope of the curve 181, which gain is assumed in the present operating example to be unity. The positive offset of the signal on the conductor 69 is illustrated in FIG. 3 by the vertical distance along the Y axis between the curve 181 and the X axis.

The presence of the error signal on the input terminal 1 also produces on the second channel conductor 85 an amplifier output signal from the amplifier 13 which follows the error signal with the gain of the amplifier 13' and with a negative offset determined by the value of the bias signal on the conductor 149. The relationship between the signal on the conductor 85 and the error signal on the input terminal 1 is illustrated in FIG. 3 by the dashed line curve 183. The slope of this curve illustrates the gain of the amplifier 13, which is, again, assumed to be unity for the present operating example. The negative offset of the signal on the conductor 85 is illustrated by the distance along the Y axis between the curve 183 and the X axis. Due to the assumed equality between the gains of the amplifiers 9 and 13, the curves 181 and 183 are parallel in FIG. 3.

The error signal present on the input terminal 1 also produces a third channel signal on the conductor 111. This signal has a gain with respect to the error signal which is determined by the position of the slider 109 along the body of the resistor 17. By adjusting the position of the knob 161, this gain can be varied between upper and lower limits, the upper limit being something less than unity due to the presence of the resistor 103. The relationship between the signal on the conductor 111 and the error signal on the input terminal 1 is shown in FIG. 3 by the dashed line curve 185 for a given position of the slider 109 and, hence, for a corresponding given value of the gain of the third channel. This assumed gain is, of course, represented by the slope of the curve 185.

As is shown in FIG. 3, the third channel signal curve 185 intersects the first channel signal curve 181 at a point 187, and intersects the second channel signal curve 183 at a point 189. These points 187 and 189 represents the limits or extremes of the deadband or range of error signal values for which the generator output signal follows the error signal with the gain determined by the position of the slider 109. It is also seen that the positions of the points 187 and 189 and, hence, the width of the deadband, are determined by the value of the bias signal as determined, in turn, by the adjusted position of the slider 141. Consequently, once the knob 161 has been positioned to yield the desired deadband gain, the positioning of the knob 157 sets the deadband width.

The relationship between the output signal produced at the apparatus output conductor 71 and the output terminal 5, and the error signal applied to the apparatus input terminal 1, is shown by the solid line curve 191 which has been superimposed upon portions of the dashed line curves 181, 183, and 185 in FIG. 3. When the error signal varies within the deadband, the signal on the conductor 111 varies between the values at the points 187 and 189, and the output signal on the terminal 5 follows the error signal with the gain determined by the adjusted position of the contact 109, as shown by the central portion of the curve 191. The operation of the apparatus which causes this to take place will now be described.

As long as the error signal lies within the deadband, the following conditions obtain:
1. The signal on the conductor 111 is negative with respect to the signal on the conductor 69, and is positive with respect to the signal on the conductor 85;
2. The input terminal 25 of the comparator 21 is positive with respect to the input terminal 27;
3. The output signal of the comparator 21 on the output terminal 29 is positive, whereby the FET switch 11 is off, and the signal on the first channel conductor 69 is isolated from the output conductor 71 and the output terminal 5;
4. The input terminal 31 of the comparator 23 is positive with respect to the input terminal 33;
5. The output of the comparator 23 on the output terminal 35 is positive, whereby the FET switch 15 is off, and the signal on the second channel conductor 85 is isolated from the output conductor 71 and the output terminal 5;
6. The resulting positive signals on the cathodes of the diodes 37 and 39 cause the transistor 41 to be off;
7. There is substantially zero voltage on the gate of the third channel FET switch 19, whereby the latter is on and effectively connects the third channel conductor 111 to the output conductor 71 and the output terminal 5;
8. Consequently, the FET switches 11 and 15 are off or open, the FET switch 19 is on or closed, and the output signal on the output terminal 5 follows the error signal on the input terminal 1 as shown by the central portion of the solid line curve 191 lying between the points 187 and 189.

When the error signal lies below the deadband, the following conditions obtain:
1. The signal on the conductor 111 is now positive with respect to the signal on the conductor 69, and is still positive with respect to the signal on the conductor 85;
2. The comparator input terminal 27 is positive with respect to the input terminal 25;
3. The comparator output signal on the output terminal 29 is negative, whereby the FET switch 11 is on, the first channel conductor 69 is effectively connected to the output conductor 71, and the first channel signal on the conductor 69 effectively appears on the output terminal 5;
4. The comparator input terminal 31 remains positive with respect to the comparator input terminal 33;
5. The FET switch 15 remains off, and the signal on the second channel conductor 85 remains isolated from the output terminal 5;
6. The cathode of the diode 37 is negative, whereby the transistor 41 is on and causes a positive voltage to be applied to the gate of the FET switch 19;
7. The FET switch 19 is off, and the signal on the third channel conductor 111 is effectively isolated from the output terminal 5;
8. Consequently, the FET switch 11 is on or closed, the FET switches 15 and 19 are off or open, and the output signal on the output terminal 5 follows the error signal on the input terminal 1 as shown by the portion of the solid line curve 191 lying on the dashed line curve 181.

When the error signal lies above the deadband, the following conditions obtain:
1. The signal on the conductor 111 is now negative with respect to both the signal on the conductor 69 and the signal on the conductor 85;
2. The comparator input terminal 25 is positive with respect to the input terminal 27;
3. The comparator output signal on the output terminal 29 is positive, whereby the FET switch 11 is off, and the signal on the first channel conductor 69 is isolated from the output terminal 5;
4. The comparator input terminal 33 is positive with respect to the input terminal 31;
5. The comparator output signal on the output terminal 35 is negative, whereby the FET switch 15 is on, the second channel conductor 85 is effectively connected to the output conductor 71, and the second channel signal on the conductor 85 effectively appears on the output terminal 5;
6. The cathode of the diode 39 is negative, whereby the transistor 41 is on and causes a positive voltage to be applied to the gate of the FET switch 19;
7. The FET switch 19 is off, and the signal on the third channel conductor 111 is effectively isolated from the output terminal 5;
8. Consequently, the FET switches 11 and 19 are off or open, the FET switch 15 is on or closed, and the output signal on the output terminal 5 follows the input signal on the input terminal 1 as shown by the portion of the solid line curve 191 lying on the dashed line curve 183.

In summary, it is noted that the FET switches 11 and 15 are open, the FET switch 19 is closed, and the generator output signal on the output terminal 5 follows the error signal on the input terminal 1, with a gain determined by the adjusted position of the slider 109, as long as the error signal lies within the deadband. This action is illustrated by the central portion of the solid line curve 191. The width of the deadband, between the points 187 and 189, depends upon the adjusted position of the slider 141. Consequently, the elements 17, 109, 161 and 163 constitute a so-called deadband gain control means, and the elements 49, 141, 157, and 159 constitute a so-called deadband width control means.

When the error signal lies below the deadband, the FET switch 11 is closed, the FET switches 15 and 19 are open, and the output signal on the output terminal 5 follows the error signal with the gain of the amplifier 9. This is illustrated by the portion of the solid line curve 191 lying to the left of the point 187.

When the error signal lies above the deadband, the FET switch 15 is closed, the FET switches 11 and 19 are open, and the output signal on the terminal 5 follows the error signal with the gain of the amplifier 13. This is illustrated by the portion of the solid line curve 191 lying to the right of the point 189.

The above-noted positive feedback action provided by the connection including the conductor 123 and the resistors 43 and 45 will now be described. Each time that the error signal moves back into the deadband, the transistor 41 turns off, thereby turning on the FET switch 19. As this occurs, the signal on the slider 109 tends to drop, due to the resulting connection of the output terminal 5 and the external load to the slider 109. Such a drop is in a direction which tends to turn the transistor 41 back on and hence to turn the FET switch 19 off again. Such undesirable action is prevented by the conductor 123 and the resistors 43 and 45, which, upon each turn-off of the transistor 41 and turn-on of the FET switch 19, produce a positive feedback effect in the outputs of the amplifiers 9 and 13 which counteracts the effect tending to turn the transistor 41 back on and the FET switch 19 back off. Consequently, for each turn-on of the FET switch 19, the latter is kept on until the error signal next moves out of the deadband.

TYPICAL VALUES

By way of illustration and example, and not by way of limitation, it is noted that an apparatus of the form of that illustrated in FIG. 1 which was constructed and successfully operated had the following values and types of circuit components and values of supply voltages:

| RESISTOR | 17 | 1K OHMS |
|---|---|---|
| " | 43 | 62 MEGOHMS |
| " | 45 | 62 MEGOHMS |
| " | 49 | 1K OHMS |
| " | 61 | 15K OHMS |
| " | 63 | 4.99K OHMS |
| " | 65 | 1.2K OHMS |
| " | 67 | 15K OHMS |
| " | 81 | 15K OHMS |
| " | 83 | 15K OHMS |
| " | 87 | 15K OHMS |
| " | 91 | 15K OHMS |
| " | 103 | 3.83K OHMS |
| " | 105 | 88.7 OHMS |
| " | 113 | 1 MEGOHM |
| " | 115 | 1 MEGOHM |
| " | 117 | 10K OHMS |
| " | 119 | 1 MEGOHM |
| " | 121 | 10K OHMS |
| " | 127 | 330 OHMS |
| " | 133 | 6.34K OHMS |
| " | 135 | 1K OHMS |
| " | 151 | 15K OHMS |
| " | 153 | 15K OHMS |
| FET'S 11, 15, 19 | | 2N4360 |
| DIODES 37, 39 | | 1N4448 |
| TRANSISTOR 41 | | 2N3906 |
| OP AMPS. 21, 23, 51, 53, 73 | | 741K |
| ZENER DIODE 131 | | 1N965B |
| ZENER DIODE 139 | | 1N825 |
| + VOLTS (REFERENCE) | | 3.3 |
| ++ VOLTS | | 25 |

It is believed to be clear from the foregoing description that the described apparatus according to the present invention fulfills the objects stated herein. Thus, it has been shown that the apparatus consistently provides the desired positive switching and abrupt transition from one gain value to the other as the input signal moves in and out of the deadband, and does this with a desirably simple, reliable, and readily produced structure which is extremely well suited to the use of present day components and fabricating techniques.

The embodiments of the invention in which an exclusive property or privilege is claimed are defined as follows:

1. Non-linear function generator apparatus comprising an input connection arranged to receive an input signal, an output connection, a first amplifier having an input connected to said input connection and to a source of a bias signal, and having an output in which said amplifier produces an output signal which follows said input signal with an offset determined by said bias signal, a second amplifier having an input connected to said input connection and to said source of bias signal, and having an output in which said second amplifier produces an output signal which follows said input signal with an offset determined by said bias signal and of the opposite sense with respect to the first-mentioned offset, a first semiconductor switch having a principle electrode path connected between said output of said first amplifier and said output connection and having a control electrode, a second semiconductor switch having a principle electrode path connected between said output of said second amplifier and said output connection and having a control electrode, and means connected to said control electrodes and responsive to said amplifier output signals and to a third signal which follows said input signal to turn on solely said first switch when said third signal lies on one side of both of said amplifier output signals, to turn on solely said second switch when said third signal lies on the opposite side of both of said amplifier output signals, and to apply said third signal to said output connection solely when said third signal lies between said amplifier output signals.

2. Non-linear function generator apparatus comprising an input connection arranged to receive an input signal, an output connection, first and second amplifiers, each having an input connected to said input connection and having an output, gain determining means having an input connected to said input connection and having an output, bias means connected to said amplifiers to cause said first amplifier to produce an output signal in its said output which follows said input signal with the gain of said first amplifier and with a positive offset determined by said bias means, and to cause said second amplifier to produce an output signal in its said output which follows said input signal with the gain of said second amplifier and with a negative offset determined by said bias means, the latter thereby establishing a signal band in the apparatus, and switching means connected between said outputs and said output connection for connecting solely said output of said first amplifier to said output connection when said input signal is below said band, for connecting solely said output of said second amplifier to said output connection when said input signal is above said band, and for connecting solely said output of said gain determining means to said output connection when said input signal is within said band.

3. Apparatus as specified in claim 2, wherein said bias means supplies a bias signal to the input of each of said amplifiers to produce said offsets in said amplifier output signals.

4. Non-linear function generator apparatus comprising an input connection arranged to receive an input signal, an output connection, a first channel including a first amplifier and a first switch means connected in series between said input and output connections, a second channel including a second amplifier and a second switch means connected in series between said input and output connections, a third channel including a gain determining means and a third switch means connected in series between said input and output connections, bias means connected to supply a bias signal to said first and second channels which causes said first amplifier to produce an output signal which follows said input signal with the gain of said first amplifier and with a positive offset determined by said bias signal, and which causes said second amplifier to produce an output signal which follows said input signal with the gain of said second amplifier and with a negative offset determined by said bias signal, the latter thereby establishing a signal band in the apparatus, first means connected to said first and third channels and to said first and third switch means for closing said third switch means and opening said first switch means when said input signal is within said band, and for opening said third switch means and closing said first switch means when said input signal lies below said band, and second means connected to said second and third channels and to said second and third switch means for closing said third switch means and opening said second switch means when said input signal lies within said band, and for opening said third switch means and closing said second switch means when said input signal lies above said band, whereby an output signal is produced in said output connection which follows said input signal with a gain determined by said determining means when said input signal lies within said band, which follows said input signal with the gain of said first amplifier when said input signal lies below said band, and which follows said input signal with the gain of said second amplifier when said input signal lies above said band.

5. Non-linear function generator apparatus comprising an input connection arranged to receive an input signal, an output connection, a first channel including a first amplifier and a first switch means connected in series between said input and output connections, a second channel including a second amplifier and a second switch means connected in series between said input and output connections, a third channel including a gain determining means and a third switch means connected in between said input and output connections, bias means connected to supply a bias signal to said first and second channels which causes said first amplifier to produce an output signal which follows said input signal with the gain of said first amplifier and with a positive offset determined by said bias signal, and which causes said second amplifier to produce an output signal which follows said input signal with the gain of said second amplifier and with a negative offset determined by said bias signal, the latter thereby establishing a signal band in the apparatus, a first comparator having first and second input connections connected, respectively, to said first and third channels, and having an output connection to said first and third switch means for closing said third switch means and opening said first switch means when a signal in said third channel from said determining means lies between said amplifier output signals, and for opening said third switch means and closing said first switch means when said signal in said third channel lies above both of said amplifier output signals, and a second comparator having first and second input connections connected, respectively, to said second and third channels, and having an output connection to said second and third switch means for closing said third switch means and opening said second switch means when said signal in said third channel lies between said amplifier output signals, and for opening said third switch means and closing said second switch means when said signal in said third channel lies below both of said amplifier output signals, whereby an output signal is produced in said output connection which follows said input signal with a gain determined by said determining means when said input signal lies within said band, which follows said input signal with the gain of said first amplifier when said input signal lies below said band, and which follows said input signal with the gain of said second amplifier when said input signal lies above said band.

6. Apparatus as specified in claim 5, wherein each of said switch means is a field effect transistor, each of said amplifiers includes an input connected to said input connection and an output connected through the source-drain path of the corresponding one of said transistors to said output connection, and each of said comparator output connections includes a connection to the gates of the corresponding ones of said transistors.

* * * * *